(12) United States Patent
Ko et al.

(10) Patent No.: US 12,388,423 B2
(45) Date of Patent: Aug. 12, 2025

(54) DATA RECEIVER CIRCUIT INCLUDING LOOP-UNROLLED PHASE DECISION FEEDBACK EQUALIZER WITH DUTY CYCLE CONTROL

(71) Applicant: QUALCOMM Incorporated, San Diego, CA (US)

(72) Inventors: Seokkyun Ko, San Diego, CA (US); Ashwin Sethuram, San Clemente, CA (US); Jeffrey Mark Hinrichs, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 37 days.

(21) Appl. No.: 18/340,665

(22) Filed: Jun. 23, 2023

(65) Prior Publication Data

US 2024/0429900 A1 Dec. 26, 2024

(51) Int. Cl.
| | |
|---|---|
| *H03K 7/08* | (2006.01) |
| *H03K 3/017* | (2006.01) |
| *H03K 19/173* | (2006.01) |
| *H03K 19/20* | (2006.01) |
| *H04B 1/16* | (2006.01) |

(52) U.S. Cl.
CPC ............. *H03K 3/017* (2013.01); *H03K 7/08* (2013.01); *H03K 19/1737* (2013.01); *H03K 19/20* (2013.01); *H04B 1/16* (2013.01)

(58) Field of Classification Search
CPC ............ H03K 3/01; H03K 3/017; H03K 5/01; H03K 5/04; H03K 5/05; H03K 7/00; H03K 7/08; H03K 19/173; H03K 19/1733; H03K 19/1737; H03K 19/20; H04B 1/06; H04B 1/16; G01R 19/16566; G01R 19/16576

See application file for complete search history.

(56) References Cited

U.S. PATENT DOCUMENTS

| | | | |
|---|---|---|---|
| 8,923,442 B2 | 12/2014 | Chandrasekaran | |
| 10,418,978 B1 | 9/2019 | Au Yeung et al. | |
| 2014/0132236 A1* | 5/2014 | Darmawaskita | ...... H02M 3/156 323/283 |

OTHER PUBLICATIONS

Awny et al., "Design and Measurement Techniques for an 80 GB/s 1-Tap Decision Feedback Equalizer.", Feb. 2014, IEEE Journal of Solid-State Circuits, vol. 49, No. 2, pp. 452-470.*

(Continued)

*Primary Examiner* — Long Nguyen
(74) *Attorney, Agent, or Firm* — Loza & Loza, LLP

(57) ABSTRACT

A data signal receiver circuit, including: a comparator configured to generate a first data signal based on a comparison of an input data signal and a reference voltage, wherein the first data signal includes a first logic low pulse and a first logic high pulse; and a duty cycle control circuit configured to generate: a second data signal based on the first data signal, wherein the second data signal includes a second logic low pulse responsive to the first logic low pulse, wherein the second logic low pulse has a width greater than a unit interval (UI); and a third data signal based on the first data signal, wherein the third data signal includes a second logic high pulse responsive to the first logic high pulse, wherein the second logic high pulse has a width greater than the UI.

26 Claims, 6 Drawing Sheets

(56) References Cited

OTHER PUBLICATIONS

Awny A., et al., "Design and Measurement Techniques for an 80 GB/s 1-Tap Decision Feedback Equalizer", IEEE Journal of Solid-state Circuits, IEEE, USA, vol. 49, No. 2, Feb. 1, 2014, pp. 452-470, XP011538054, Figures 1c, 2.
International Search Report and Written Opinion—PCT/US2024/029744—ISA/EPO—Sep. 9, 2024.
Kimura H., et al., "A 28 GB/s 560 mW Multi-Standard SerDes With Single-Stage Analog Front-End and 14-Tap Decision Feedback Equalizer in 28 nm CMOS", IEEE Journal of Solid-state Circuits, IEEE, USA, vol. 49, No. 12, Dec. 1, 2014, pp. 3091-3103, XP011564880, Figures 2, 5, sections II-B and II-C.
Kim Y-J., et al., "A 16-GB, 18-GB/s/pin GDDR6 DRAM With Per-Bit Trainable Single-Ended DFE and PLL-Less Clocking", IEEE Journal Of Solid-State Circuits, vol. 54, No. 1, Jan. 2019, pp. 197-209.
Razavi B., "The Decision-Feedback Equalizer", A Circuit for All Seasons, Nov. 16, 2017, 5 Pages.

* cited by examiner

DATA RECEIVER CIRCUIT INCLUDING LOOP-UNROLLED PHASE DECISION FEEDBACK EQUALIZER WITH DUTY CYCLE CONTROL

FIELD

Aspects of the present disclosure relate generally to data communication links, and in particular, to a data receiver circuit including a loop-unrolled phase decision feedback equalizer (DFE) with duty cycle control.

BACKGROUND

Data communication links, such as serializer/deserializer (SERDES) links, are used to communicate data signals between integrated circuits (ICs) and other components. Such data signals may be communicated over a set of transmission lines (e.g., metal traces) formed on a printed circuit board (PCB). Such transmission lines typically have parasitic inductance and capacitance, which adversely affects the high frequency content of the data signals. As a consequence, successful detection of the data signals at a receiving end may be difficult as a result of the parasitic effects of the transmission lines.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to a data signal receiver circuit. The data signal receiver circuit includes: a comparator configured to generate a first data signal based on a comparison of an input data signal and a reference voltage, wherein the first data signal includes a first logic low pulse and a first logic high pulse; and a duty cycle control circuit configured to generate: a second data signal based on the first data signal, wherein the second data signal includes a second logic low pulse based on the first logic low pulse, wherein the second logic low pulse has a width greater than a unit interval (UI); and a third data signal based on the first data signal, wherein the third data signal includes a second logic high pulse based on the first logic high pulse, wherein the second logic high pulse has a width greater than the UI.

Another aspect of the disclosure relates to a data signal receiver circuit. The data signal receiver circuit includes: a comparator including a first input configured to receive an input data signal, a second input configured to receive a reference voltage; a duty cycle control circuit including an input coupled to an output of the comparator; a first multiplexer including a first input coupled to a first output of the duty cycle control circuit, a second input coupled to a second output of the duty cycle control circuit; a second multiplexer including a first input coupled to the first output of the duty cycle control circuit, a second input coupled to the second output of the duty cycle control circuit; a first flip-flop including a data input coupled to an output of the first multiplexer, a clock input configured to receive a non-complementary clock signal, and an output configured to generate a first output data signal, wherein the output of the first flip-flop is coupled to a select input of the second multiplexer; and a second flip-flop including a data input coupled to an output of the second multiplexer, a clock input configured to receive a complementary clock signal, and an output configured to generate a second output data signal, wherein the output of the second flip-flop is coupled to a select input of the first multiplexer.

Another aspect of the disclosure relates to a method. The method includes: comparing an input data signal to a reference voltage to generate a first data signal including a first logic low pulse and a first logic high pulse; generating a second data signal based on the first data signal, wherein the second data signal includes a second logic low pulse based on the first logic low pulse, wherein the second logic low pulse has a width greater than a unit interval (UI); and generating a third data signal based on the first data signal, wherein the third data signal includes a second logic high pulse based on the first logic high pulse, wherein the second logic high pulse has a width greater than the UI.

Another aspect of the disclosure relates to an apparatus. The apparatus includes: means for comparing an input data signal to a reference voltage to generate a first data signal including a first logic low pulse and a first logic high pulse; means for generating a second data signal based on the first data signal, wherein the second data signal includes a second logic low pulse based on the first logic low pulse, wherein the second logic low pulse has a width greater than a unit interval (UI); and means for generating a third data signal based on the first data signal, wherein the third data signal includes a second logic high pulse based on the first logic high pulse, wherein the second logic high pulse has a width greater than the UI.

Another aspect of the disclosure relates to a wireless communication device. The wireless communication device includes: at least one antenna; a transceiver coupled to the at least one antenna; and a modem including one or more signal processing cores coupled to the transceiver, wherein at least one of the transceiver or the modem includes a data signal receiver circuit including: a comparator configured to generate a first data signal based on a comparison of an input data signal and a reference voltage, wherein the first data signal includes a first logic low pulse and a first logic high pulse; and a duty cycle control circuit configured to generate: a second data signal based on the first data signal, wherein the second data signal includes a second logic low pulse responsive to the first logic low pulse, wherein the second logic low pulse has a width greater than a unit interval (UI); and a third data signal based on the first data signal, wherein the third data signal includes a second logic high pulse responsive to the first logic high pulse, wherein the second logic high pulse has a width greater than the UL.

Another aspect of the disclosure relates to a wireless communication device. The wireless communication device includes: at least one antenna; a transceiver coupled to the at least one antenna; and a modem including one or more signal processing cores coupled to the transceiver, wherein at least one of the transceiver or the modem includes a data signal receiver circuit including: a comparator including a first input configured to receive an input data signal, a second input configured to receive a reference voltage; a duty cycle control circuit including an input coupled to an output of the comparator; a first multiplexer including a first input coupled to a first output of the duty cycle control circuit, a second input coupled to a second output of the duty cycle control circuit; a second multiplexer including a first input coupled to the first output of the duty cycle control circuit, a second input coupled to the second output of the duty cycle control circuit; a first flip-flop including a data input coupled to an output of the first multiplexer, a clock input configured to receive a non-complementary clock signal, and an output configured to generate a first output data signal, wherein the output of the first flip-flop is coupled to a select input of the second multiplexer; and a second flip-flop including a data input coupled to an output of the second multiplexer, a clock input configured to receive a complementary clock signal, and an output configured to generate a second output data signal, wherein the output of the second flip-flop is coupled to a select input of the first multiplexer.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
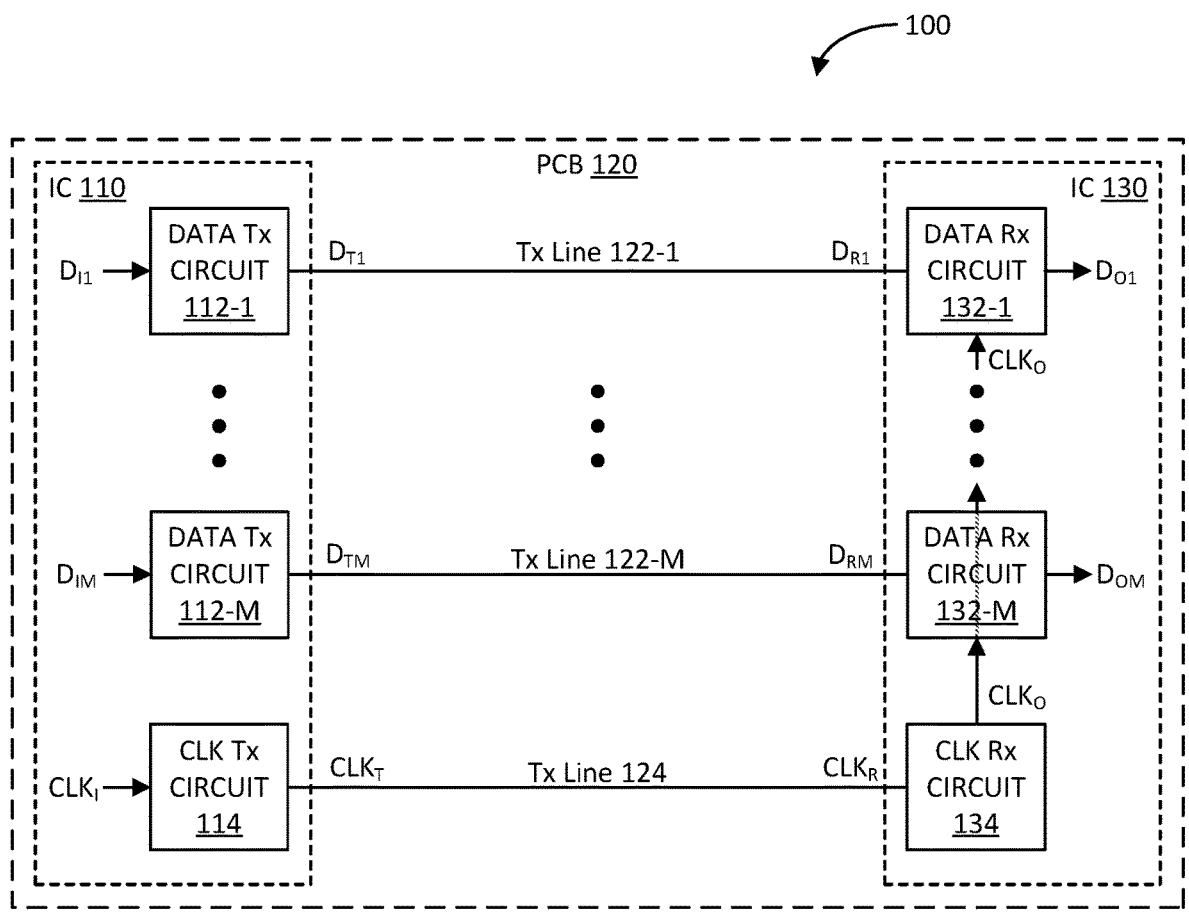
FIG. 1 illustrates a block diagram of an example data communication apparatus in accordance with an aspect of the disclosure.

FIG. 1 illustrates a block diagram of an example data communication apparatus 100 in accordance with an aspect of the disclosure. The data communication apparatus 100 may be implemented as a serializer/deserializer (SERDES) that may use single-ended data signal transmission for transmitting data from a source integrated circuit (IC) to a destination IC via a data communication channel, such as one or more metal transmission lines formed on and/or within a printed circuit board (PCB).

In particular, the data communication apparatus 100 includes a first integrated circuit (IC) 110 and a second IC 130, both of which may be securely mounted on a printed circuit board (PCB) 120. The first IC 110 may include a set of one or more data signal transmitter (Tx) circuits 112-1 to 112-M. Additionally, the first IC 110 may include a clock signal transmitter (Tx) circuit 114.

The set of one or more data signal transmitter circuits 112-1 to 112-M are configured to receive a set of one or more input data signals $D_{I1}$ to $D_{IM}$, and generate a set of one or more transmit data signals $D_{T1}$ to $D_{TM}$ based on the set of one or more input data signals $D_{I1}$ to $D_{IM}$, respectively. The set of one or more data signal transmitter circuits 112-1 to 112-M are coupled to a set of one or more transmission lines (e.g., metal traces) 122-1 to 122-M formed on and/or within the PCB 120 for transmission of the set of one or more transmit data signals $D_{T1}$ to $D_{TM}$ to the second IC 130, respectively. Similarly, the clock signal transmitter circuit 114 is configured to receive an input clock signal $CLK_I$, and generate a transmit clock signal $CLK_T$ based on the input clock signal $CLK_I$. A clock signal, as defined herein, is a substantially periodic signal (e.g., substantially square wave) whose frequency controls the rate at which data is sent from the IC 110 to the IC 130. The clock signal transmitter circuit 114 is coupled to a transmission line (e.g., metal trace) 124 formed on and/or within the PCB 120 for transmission of the transmit clock signal $CLK_T$ to the second IC 130.

The second IC 130 may include a set of one or more data signal receiver (Rx) circuits 132-1 to 132-M. Additionally, the second IC 130 includes a clock signal receiver (Rx) circuit 134. The clock signal receiver circuit 134 is coupled to the transmission line 124 to receive a clock signal $CLK_R$ (e.g., the transmit clock signal $CLK_T$ after propagating via the transmission line 124), and generate an output clock signal $CLK_O$ based on the received clock signal $CLK_R$. The set of one or more data signal receiver circuits 132-1 to 132-M are coupled to the set of one or more data transmission lines 122-1 to 122-M to receive a set of one or more data signals $D_{R1}$ to $D_{RM}$ from the first IC 110 (e.g., the set of transmit clock signals $CLK_{T1}$ to $CLK_{TM}$ after propagating via the set of transmission lines 122-1 to 122-M), respectively. The set of one or more data signal receiver circuits 132-1 to 132-M are configured to generate a set of one or more output data signals $D_{O1}$ to DOM based on the set of one or more received data signals $D_{R1}$ to $D_{RM}$ and the output clock signal $CLK_O$, respectively.

Although, in this example, the data communication apparatus 100 is described as being unidirectional (e.g., data being transmitted from the IC 110 to the IC 130), it shall be understood that the data communication apparatus 100 may be implemented for bidirectional data communication in a similar manner.

Figure 2:
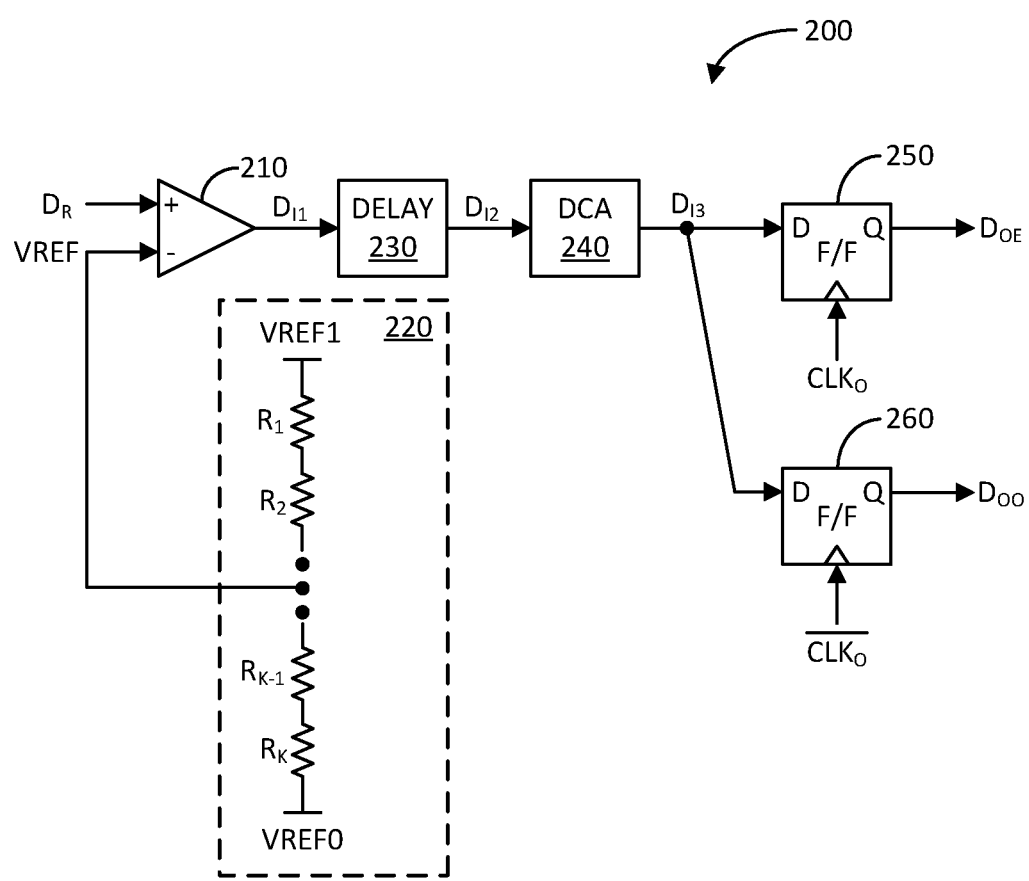
FIG. 2 illustrates a block diagram of an example data signal receiver circuit in accordance with another aspect of the disclosure.

FIG. 2 illustrates a block diagram of an example data signal receiver circuit 200 in accordance with another aspect of the disclosure. The data signal receiver circuit 200 may be an example detailed implementation of any of the data signal receiver circuits 132-1 to 132-M of data communication apparatus 100 previously discussed.

The data signal receiver circuit 200 includes a comparator (e.g., amplifier) 210, a reference voltage generator 220, a signal delay circuit 230, a duty cycle adjuster (DCA) 240, a first flip-flop (F/F) 250, and a second flip-flop (F/F) 260. The reference voltage generator 220, in turn, includes a set of resistors $R_1$ to $R_K$ coupled in series between an upper voltage rail VREF1 (e.g., a voltage potential associated with a logic high or one (1) signal), and a lower voltage rail VREF0 (e.g., a voltage potential associated with a logic low or zero (0) signal). The reference voltage generator 220 is configured to generate a reference voltage VREF at an intermediate node between adjacent pair of the set of resistors $R_1$ to $R_K$. It shall be understood that the set of resistors $R_1$ to $R_K$ may be implemented as a continuous resistive material extending from the VREF1 to VREF0 voltage rails, with a tap therebetween to generate the reference voltage VREF. For example, the reference voltage VREF may be substantially half the difference between VREF1 and VREF0.

The comparator 210 includes a first (e.g., positive) input coupled to a corresponding transmission line (not shown) to receive a data signal $D_R$ therefrom. The comparator 210 further includes a second (e.g., negative) input coupled to the reference voltage generator 220 to receive the reference voltage VREF therefrom. The comparator 210 is configured to generate a first intermediate data signal $D_{I1}$ based on a comparison of the data signal $D_R$ with the reference voltage VREF. For example, if the data signal $D_R$ is greater than the reference voltage VREF, then the comparator 210 generates the first intermediate data signal $D_{I1}$ at a logic high voltage (e.g., ~VREF1). If the data signal $D_R$ is less than the reference voltage VREF, then the comparator 210 generates the first intermediate data signal $D_{I1}$ at a logic low voltage (e.g., ~VREF0).

The signal delay circuit 230 is configured to delay the first intermediate data signal $D_{I1}$ to generate a second intermediate data signal $D_{I2}$. The delay effectuated by the signal delay circuit 230 may be programmable or adjustable to timely align a third intermediate data signal $D_{I3}$ at the inputs of the flip-flops 250 and 260 with clock signal $CLK_O/\overline{CLK_O}$ to improve or substantially optimize the sampling of the data signal $D_{I3}$ (e.g., to meet setup and hold time margin requirements). The duty cycle adjuster (DCA) 240 is configured to adjust the duty cycle of the second intermediate data signal $D_{I2}$ to generate the third intermediate data signal $D_{I3}$. For example, the duty cycle adjuster (DCA) 240 may adjust the duty cycle of the second intermediate data signal $D_{I2}$ so that the third intermediate data signal $D_{I3}$ has substantially 50 percent duty cycle. This may also improve or optimize the sampling of the third intermediate signal $D_{I3}$ by the flip-flops 250 and 260. As mentioned, the flip-flops 250 and 260 are configured to sample the third intermediate signal $D_{I3}$ based on complementary clock signals $CLK_O$ and $\overline{CLK_O}$ to generate even and odd output data signals $D_{OE}$ and $D_{OO}$, respectively.

As previously mentioned, the transmission line by which the comparator 210 receives the data signal $D_R$ may have significant parasitic series inductance and shunt capacitance. As a consequence, high frequency content of the data signal $D_R$ may have been significantly attenuated, resulting in rounding of transitional edges and an overall time spreading of each data pulse. Typically, the time spreading of data pulses results in intersymbol interference (ISI), where one data pulse spreads into an adjacent data pulse. As a result, ISI adversely affect the sampling of the data signal $D_{I3}$, such as by not meeting setup and hold time margin requirements.

In data signal receiver circuit 200, a way to combat the adverse effects of ISI is to reduce the data rate of the data signal. However, this may not be practical as faster data transmission and processing for improved user experience is often desirable.

Figure 3:
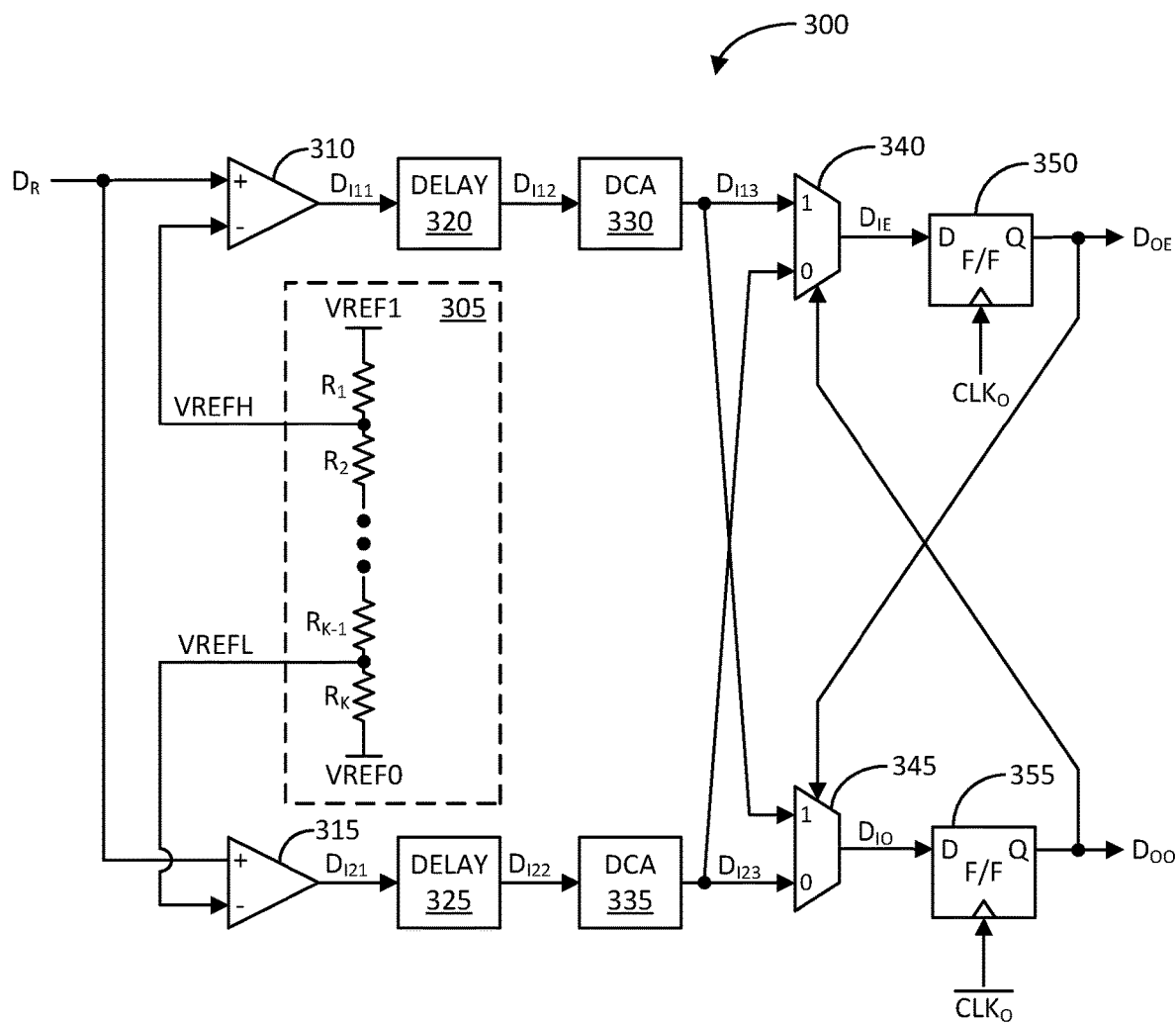
FIG. 3 illustrates a block diagram of another example data signal receiver circuit including a voltage-based loop-unrolled phase decision feedback equalizer (DFE) in accordance with another aspect of the disclosure.

FIG. 3 illustrates a block diagram of another example data signal receiver circuit 300 including a voltage-based loop-unrolled phase decision feedback equalizer (DFE) in accordance with another aspect of the disclosure. The data signal receiver circuit 300 may be another example detailed implementation of any of the data signal receiver circuits 132-1 to 132-M of data communication apparatus 100 previously discussed.

In summary, the voltage-based loop-unrolled DFE compensates the narrowing of a current data pulse due to spreading of a previous (e.g., immediately preceding) data pulse as a result of parasitic reactance of the channel or transmission medium by which the data pulses are received. For example, with regard to the current data pulse being a logic low pulse, the voltage-based loop-unrolled DFE generates two candidate logic low pulses, one having a pulse width greater than a unit interval (UI) associated with the received data signal. A UI is a width of a substantially 50 percent duty cycle data pulse of a data signal. If the previous data pulse was a logic high pulse, the voltage-based loop-unrolled DFE selects the candidate logic low pulse with the greater pulse width to compensate for the ISI spreading caused by the previous logic high pulse. If the previous data pulse was a logic low pulse, the voltage-based loop-unrolled DFE may select the candidate logic low pulse with the smaller pulse width as there is substantially no ISI associated with consecutive logic low pulses.

Similarly, with regard to the current data pulse being a logic high pulse, the voltage-based loop-unrolled DFE generates two candidate logic high pulses, one having a pulse width greater than the UI associated with the received data signal. If the previous data pulse was a logic zero pulse, the voltage-based loop-unrolled DFE selects the candidate logic high pulse with the greater pulse width to compensate for the ISI spreading caused by the previous logic low pulse. If the previous data pulse was a logic high pulse, the voltage-based loop-unrolled DFE may select the candidate logic high pulse with the smaller pulse duration as there is substantially no ISI associated with consecutive logic high pulses.

In particular, the data signal receiver circuit 300 includes a first comparator (e.g., amplifier) 310, a first signal delay circuit 320, a first duty cycle adjuster (DCA) 330, a first multiplexer 340, and a first flip-flop (F/F) 350. The data signal receiver circuit 300 further includes a second comparator (e.g., amplifier) 315, a second signal delay circuit 325, a second duty cycle adjuster (DCA) 330, a second multiplexer 345, and a second flip-flop (F/F) 355. Additionally, the data signal receiver circuit 300 includes a reference voltage generator 305 configured to generate a first reference voltage VREFH and a second reference voltage VREFL.

The reference voltage generator 305, in turn, includes a set of resistors $R_1$ to $R_K$ coupled in series between an upper voltage rail VREF1 (e.g., a voltage potential associated with a logic high or one (1) signal), and a lower voltage rail VREF0 (e.g., a voltage potential associated with a logic low or zero (0) signal). The reference voltage generator 305 is configured to generate the first reference voltage VREFH at a first intermediate node between a first adjacent pair of the set of resistors $R_1$ to $R_K$. Similarly, the reference voltage generator 305 is configured to generate the second reference voltage VREFH at a second intermediate node between a second (different than the first) adjacent pair of the set of resistors $R_1$ to $R_K$.

In this example, the first intermediate node, at which the first reference voltage VREFH is generated, is closer to the first voltage rail VREF1 than the second voltage rail VREF0. Similarly, the second intermediate node, at which the second reference voltage VREFL, is closer to the second voltage rail VREF0 than the first voltage rail VREF1. Thus, the first reference voltage VREFH is higher than the second reference voltage VREFL. It shall be understood that the set of resistors $R_1$ to $R_K$ may be implemented as a continuous resistive material extending from the VREF1 to VREF0 voltage rails, with first and second taps therebetween to generate the first and second reference voltages VREFH and VREFL, respectively.

The first comparator 310 includes a first (e.g., positive) input coupled to a corresponding transmission line (not shown) to receive a data signal $D_R$ therefrom. The first comparator 310 further includes a second (e.g., negative) input coupled to the reference voltage generator 305 to receive the first reference voltage VREFH therefrom. The first comparator 310 is configured to generate an intermediate data signal $D_{I11}$ based on a comparison of the data signal $D_R$ with the first reference voltage VREFH. Similarly, the second comparator 315 includes a first (e.g., positive) input coupled to the corresponding transmission line (not shown) to receive the data signal $D_R$ therefrom. The second comparator 315 further includes a second (e.g., negative) input coupled to the reference voltage generator 305 to receive the second reference voltage VREFL therefrom. The second comparator 315 is configured to generate an intermediate data signal $D_{I21}$ based on a comparison of the data signal $D_R$ with the second reference voltage VREFL.

The first signal delay circuit 320 is configured to delay the intermediate data signal $D_{I11}$ to generate another intermediate data signal $D_{I12}$. The delay effectuated by the first signal delay circuit 320 may be programmable or adjustable to timely align an intermediate data signal $D_{I13}$ at the inputs of the flip-flops 350 and 360 with clock signal $CLK_O/\overline{CLK_O}$ to improve or substantially optimize the sampling of the data signal $D_{I13}$ (e.g., to meet setup and hold time margin requirements). Similarly, the second signal delay circuit 325 is configured to delay the intermediate data signal $D_{I21}$ to generate another intermediate data signal $D_{I22}$. The delay effectuated by the second signal delay circuit 325 may be programmable or adjustable to timely align an intermediate data signal $D_{I23}$ at the inputs of the flip-flops 350 and 360 with clock signal $CLK_O/\overline{CLK_O}$ to improve or substantially optimize the sampling of the data signal $D_{I23}$ (e.g., to meet setup and hold time margin requirements).

The first duty cycle adjuster (DCA) 330 is configured to adjust the duty cycle of the intermediate data signal $D_{I12}$ to generate another intermediate data signal $D_{I13}$. For example, the first duty cycle adjuster (DCA) 330 may adjust the duty cycle of the intermediate data signal $D_{I12}$ to improve the sampling of the intermediate signal $D_{I13}$ by the flip-flops 350 and 360. Similarly, the second duty cycle adjuster (DCA) 335 is configured to adjust the duty cycle of the intermediate data signal $D_{I22}$ to generate the intermediate data signal $D_{I23}$. In a like manner, the second duty cycle adjuster (DCA) 335 may adjust the duty cycle of the intermediate data signal $D_{I23}$ to improve the sampling of the intermediate signal $D_{I23}$ by the flip-flops 350 and 360.

The first multiplexer 340 includes a first "1" and second "0" inputs coupled to outputs of the first and second duty cycle adjusters (DCAs) 330 and 335 to receive therefrom the intermediate data signals $D_{I13}$ and $D_{I23}$, respectively. The first multiplexer 340 includes a first select input coupled to a data output (Q) of the second flip-flop 355 to receive an odd output data signal $D_{OO}$. Similarly, the second multiplexer 345 includes a first "1" and second "0" inputs coupled to outputs of the first and second duty cycle adjusters (DCAs) 330 and 335 to receive therefrom the intermediate data signals $D_{I13}$ and $D_{I23}$, respectively. The second multiplexer 345 includes a second select input coupled to a data output (Q) of the first flip-flop 350 to receive an even output data signal $D_{OE}$.

The first flip-flop 350 includes a data input (D) coupled to an output of the first multiplexer 340 to receive an even input data signal $D_{IE}$ (e.g., the mux outputted $D_{I13}$ or $D_{I23}$). The first flip-flop 350 includes a clock input configured to receive a non-complementary clock signal $CLK_O$. Similarly, the second flip-flop 355 includes a data input (D) coupled to an output of the second multiplexer 345 to receive an odd input data signal $D_{IO}$ (e.g., the mux outputted $D_{I13}$ or $D_{I23}$). The second flip-flop 355 includes a clock input configured to receive a complementary clock signal $\overline{CLK_O}$.

The ISI equalization compensation provided by the voltage-based loop-unrolled phase DFE operates as follows: As the first reference voltage VREFH is closer to the logic high voltage potential VREF1, the intermediate signal $D_{I11}$ (and by extension, the intermediate signal $D_{I13}$) has a narrower logic high pulse and a wider logic low pulse. Similarly, as the second reference voltage VREFL is closer to the logic low voltage potential VREF0, the intermediate signal $D_{21}$ (and by extension, the intermediate signal $D_{I23}$) has a wider logic high pulse and a narrower logic low pulse.

Thus, if the current bit is a logic zero (0) as indicated by the intermediate signal $D_{I13}$ or $D_{I23}$ and the previous bit is a logic one (1) as indicated by the output signal $D_{OE}$ or $D_{OO}$, the multiplexer 340 or 345 selects the intermediate signal $D_{I13}$ as it has a wider logic zero (0) pulse. The wider logic zero (0) pulse compensates for ISI introduced by the previous logic one (1) bit so that sampling of the signal $D_{I13}$ by the flip-flop 350 or 355 meets setup and hold time margin requirements. If the current and previous bits are both logic ones (1s), the narrower logic zero (0) pulse in intermediate signal $D_{I23}$ may not impact data sampling by the flip-flop 350 or 355 as ISI is typically not present for two consecutive logic ones (1s).

Similarly, if the if the current bit is a logic one (1) as indicated by the intermediate signal $D_{I13}$ or $D_{I23}$ and the previous bit is a logic zero (0) as indicated by the output signal $D_{OE}$ or $D_{OO}$, the multiplexer 340 or 345 selects the intermediate signal $D_{I23}$ as it has a wider logic one (1) pulse. The wider logic one (1) pulse compensates for ISI introduced by the previous logic zero (0) bit so that sampling of the signal $D_{I23}$ by the flip-flop 350 or 355 meets setup and hold time margin requirements. If the current and previous bits are logic zeros (0s), the narrower logic one (1) pulse in intermediate signal $D_{I13}$ may not impact data sampling by the flip-flop 350 or 355 as ISI is typically not present for two consecutive logic zeros (0s).

A drawback of the data signal receiver circuit 300 is that the voltage-based loop unrolled DFE occupies significant circuit footprint and consumes significant power. This is mainly because of the requirement for the second comparator 315, the second signal delay circuit 325, and the second duty cycle adjuster (DCA) 325. If such components were to be eliminated and replaced with a smaller and more power efficient circuit, savings in circuit footprint and power may be achieved.

Figure 4A:
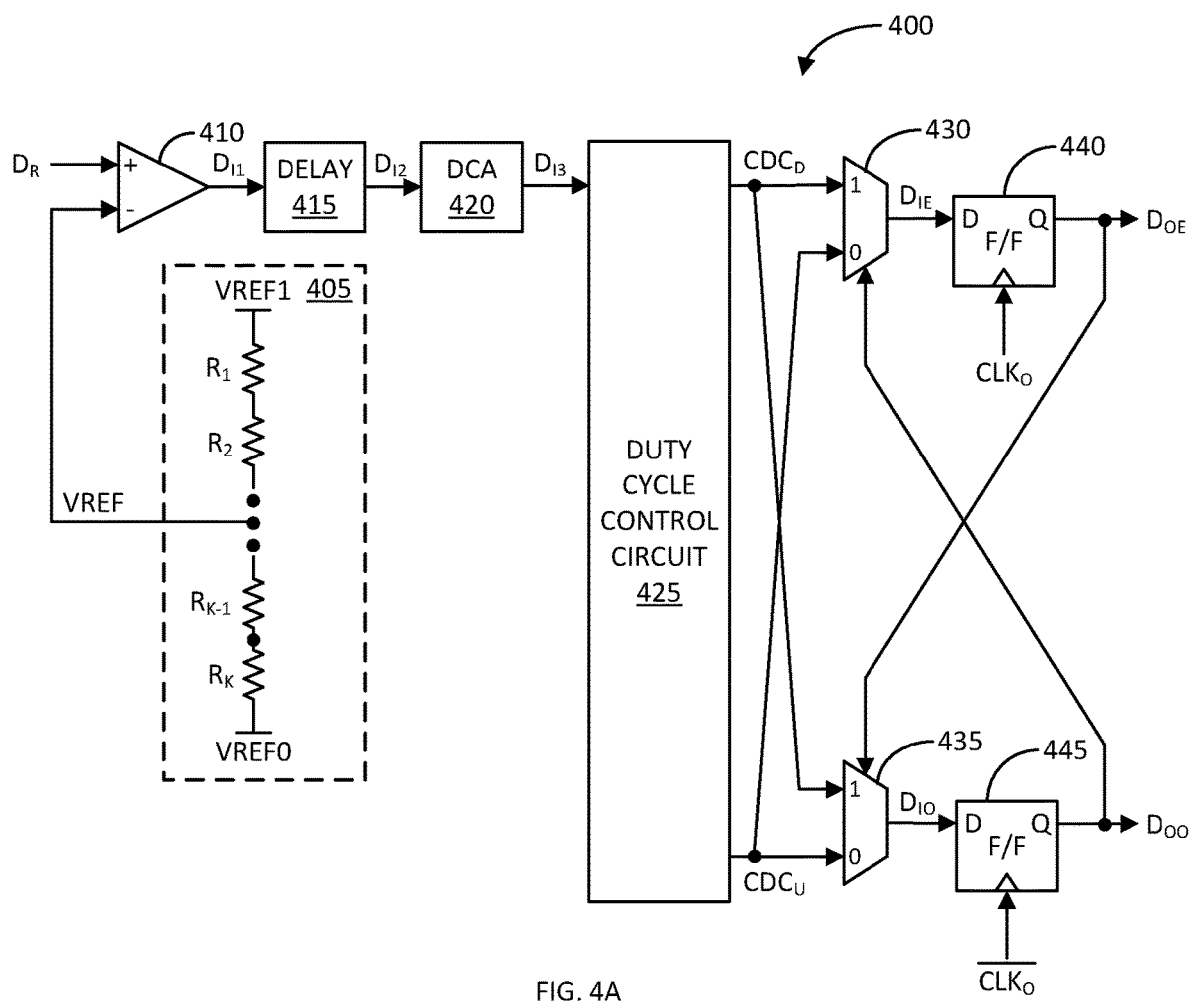
FIG. 4A illustrates a block diagram of another example data signal receiver circuit including an example loop-unrolled phase decision feedback equalizer (DFE) with duty cycle control circuit in accordance with another aspect of the disclosure.

FIG. 4A illustrates a block diagram of another example data signal receiver circuit 400 including a loop-unrolled phase decision feedback equalizer (DFE) with duty cycle control in accordance with another aspect of the disclosure. The data signal receiver circuit 400 may be another example detailed implementation of any of the data signal receiver circuits 132-1 to 132-M of data communication apparatus 100 previously discussed.

The data signal receiver circuit 400 operates in a similar manner as data signal receiver circuit 300 previously discussed in detail. Differences between the data signal receiver circuit 400 and the data signal receiver circuit 300 are as follows: (1) the second comparator 315, second signal delay circuit 325, and second duty cycle adjuster (DCA) 335 in data signal receiver circuit 300 may be eliminated in data signal receiver circuit 400; (2) the reference voltage generator 305 may generate a single reference voltage VREF; and (3) a duty cycle control circuit is included between a duty cycle adjuster (DCA) and first and second multiplexers in data signal receiver circuit 400. As discussed further herein, the replacement of the second comparator 315, second signal delay circuit 325, and second duty cycle adjuster (DCA) 335 with the duty cycle control circuit may produce significant savings in circuit footprint and power consumption.

In particular, the data signal receiver circuit 400 includes a comparator (e.g., amplifier) 410, a signal delay circuit 415, a duty cycle adjuster (DCA) 420, a duty cycle control circuit 425, a first multiplexer 430, a second multiplexer 435, a first flip-flop (F/F) 440, and a second flip-flop 445. Additionally, the data signal receiver circuit 400 includes a reference voltage generator 405 configured to generate a reference voltage VREF.

The reference voltage generator 405, in turn, includes a set of resistors $R_1$ to $R_K$ coupled in series between an upper voltage rail VREF1 (e.g., a voltage potential associated with a logic high or one (1) signal), and a lower voltage rail VREF0 (e.g., a voltage potential associated with a logic low or zero (0) signal). The reference voltage generator 405 is configured to generate a reference voltage VREF at an intermediate node between adjacent pair of the set of resistors $R_1$ to $R_K$. It shall be understood that the set of resistors $R_1$ to $R_K$ may be implemented as a continuous resistive material extending from the VREF1 to VREF0 voltage rails, with a tap therebetween to generate the reference voltage VREF. For example, the reference voltage VREF may be substantially half the difference between VREF1 and VREF0.

The comparator 410 includes a first (e.g., positive) input coupled to a corresponding transmission line (not shown) to receive a data signal $D_R$ therefrom. The comparator 410 further includes a second (e.g., negative) input coupled to the reference voltage generator 405 to receive the reference voltage VREF therefrom. The comparator 410 is configured to generate a first intermediate data signal $D_{I1}$ based on a comparison of the data signal $D_R$ with the reference voltage VREF.

The signal delay circuit 415 is configured to delay the first intermediate data signal $D_{I1}$ to generate a second intermediate data signal $D_{I2}$. The delay effectuated by the signal delay circuit 415 may be programmable or adjustable to timely align even and odd data signal $D_{IE}$ and $D_{IO}$ at respective inputs of the flip-flops 440 and 445 with clock signal $CLK_O/\overline{CLK_O}$ to improve or substantially optimize the sampling of the data signals Dm and $D_{IO}$ (e.g., to meet setup and hold time margin requirements).

The duty cycle adjuster (DCA) 420 is configured to adjust the duty cycle of the second intermediate data signal $D_{I12}$ to generate a third intermediate data signal Drs. For example, the duty cycle adjuster (DCA) 420 may adjust the duty cycle of the second intermediate data signal $D_{I2}$ so that the third intermediate data signal $D_{I3}$ has substantially 50 percent duty cycle. This may also improve or optimize the sampling the sampling of the data signals $D_{IE}$ and $D_{IO}$ by the flip-flops 440 and 445 (e.g., to meet setup and hold time margin requirements), respectively.

The duty cycle control circuit 425 includes an input coupled to an output of the duty cycle adjuster (DCA) 420 to receive the third intermediate data signal $D_{I3}$ therefrom. The duty cycle control circuit 425 is configured to generate a controlled duty cycle down signal ($CDC_D$) and a control duty cycle up signal ($CDC_U$) based on the third intermediate signal $D_{I3}$. The $CDC_D$ signal is similar to the intermediate data signal $D_{I13}$ of data signal receiver circuit 300 previously discussed. That is, $CDC_D$ signal has a wider logic low or zero (0) pulse. In a like manner, the $CDC_U$ signal is similar to the intermediate data signal $D_{I23}$ of data signal receiver circuit 300 previously discussed. That is, $CDC_U$ signal has a wider logic high or one (1) pulse.

The first and second multiplexers 430 and 435 each includes a first "1" and second "0" inputs coupled to outputs of the duty cycle control circuit 425 to receive therefrom the $CDC_D$ and $CDC_U$ data signals, respectively. The first multiplexer 430 includes a first select input coupled to a data output (Q) of the second flip-flop 445 to receive an odd output data signal $D_{OO}$. Similarly, the second multiplexer 435 includes a second select input coupled to a data output (Q) of the first flip-flop 440 to receive an even output data signal $D_{OE}$.

The first flip-flop 440 includes a data input (D) coupled to an output of the first multiplexer 430 to receive an even input data signal $D_{IE}$. The first flip-flop 440 includes a clock input configured to receive a non-complementary clock signal $CLK_O$. Similarly, the second flip-flop 445 includes a data input (D) coupled to an output of the second multiplexer 435 to receive an odd input data signal $D_{IO}$. The second flip-flop 445 includes a clock input configured to receive a complementary clock signal $\overline{CLK_O}$.

Figure 4B:
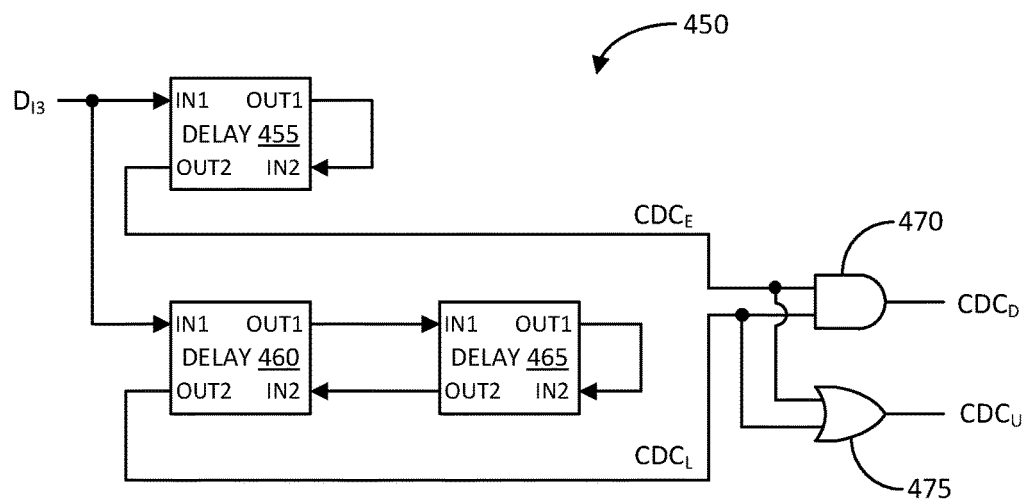
FIG. 4B illustrates a block diagram of an example duty cycle control circuit in accordance with another aspect of the disclosure.

FIG. 4B illustrates a block diagram of an example duty cycle control circuit 450 in accordance with another aspect of the disclosure. The duty cycle control circuit 450 may be an example more detailed implementation of the duty cycle control circuit 425 previously discussed.

The duty cycle control circuit 450 includes a first signal delay circuit 455, a second signal delay circuit 460, and a third signal delay circuit 465. The first signal delay circuit 455 includes a first input (IN1) configured to receive the third intermediate data signal $D_{I3}$. The first signal delay circuit 455 is configured to delay the third intermediate data signal $D_{I3}$ to generate a controlled duty cycle early ($CDC_E$) data signal. More specifically, the first signal delay circuit 455 includes a first delay path extending from the first input (IN1) to a first output (OUT1). The first signal delay circuit 455 includes a second delay path extending from a second input (IN2) to a second output (OUT2) at which the $CDC_E$ data signal is produced. The first output (OUT1) is coupled to the second input (IN2). Each of the first and second delay paths may use current starved inverters controlled by a bandgap circuit to effectuate a signal delay that is substantially process voltage and temperature (PVT) invariant or controlled.

The second signal delay circuit 460 includes a first input (IN1) configured to receive the third intermediate data signal $D_{I3}$. The second and third signal delay circuits 460 and 465 are cascaded to collectively or cumulatively delay the third intermediate data signal $D_{I3}$ to generate a controlled duty cycle late ($CDC_L$) data signal. More specifically, the second signal delay circuit 460 includes a first delay path extending from its first input (IN1) to its first output (OUT1). Similarly, the third signal delay circuit 465 includes a second delay path extending from its first input (IN1) to its first output (OUT1), where its first input (IN1) is coupled to the first output (OUT1) of the second signal delay circuit 460. The first output (OUT1) is coupled to a second input (IN2) of the third signal delay circuit 465.

The third signal delay circuit 465 includes a third delay path extending from its second input (IN2) to its second output (OUT2). Similarly, the second signal delay circuit 460 includes a fourth delay path extending from its second input (IN2) to its second output (OUT2), where its second input (IN2) is coupled to the second output (OUT2) of the third signal delay circuit 465. The $CDC_L$ data signal is produced at the second output (OUT2) of the second signal delay circuit 460. Each of the aforementioned first, second, third, and fourth delay paths may use current starved inverters controlled by the bandgap circuit to effectuate a signal delay that is substantially PVT invariant or controlled.

The duty cycle control circuit 450 further includes an AND gate 470 including inputs coupled to the second outputs (OUT2) of the first and second signal delay circuits 455 and 460, respectively. The AND gate 470 includes an output configured to generate the $CDC_D$ data signal. Similarly, the duty cycle control circuit 450 further includes an OR gate 475 including inputs coupled to the second outputs (OUT2) of the first and second signal delay circuits 455 and 460, respectively. The OR gate 475 includes an output configured to generate the $CDC_U$ data signal.

Figure 4C:
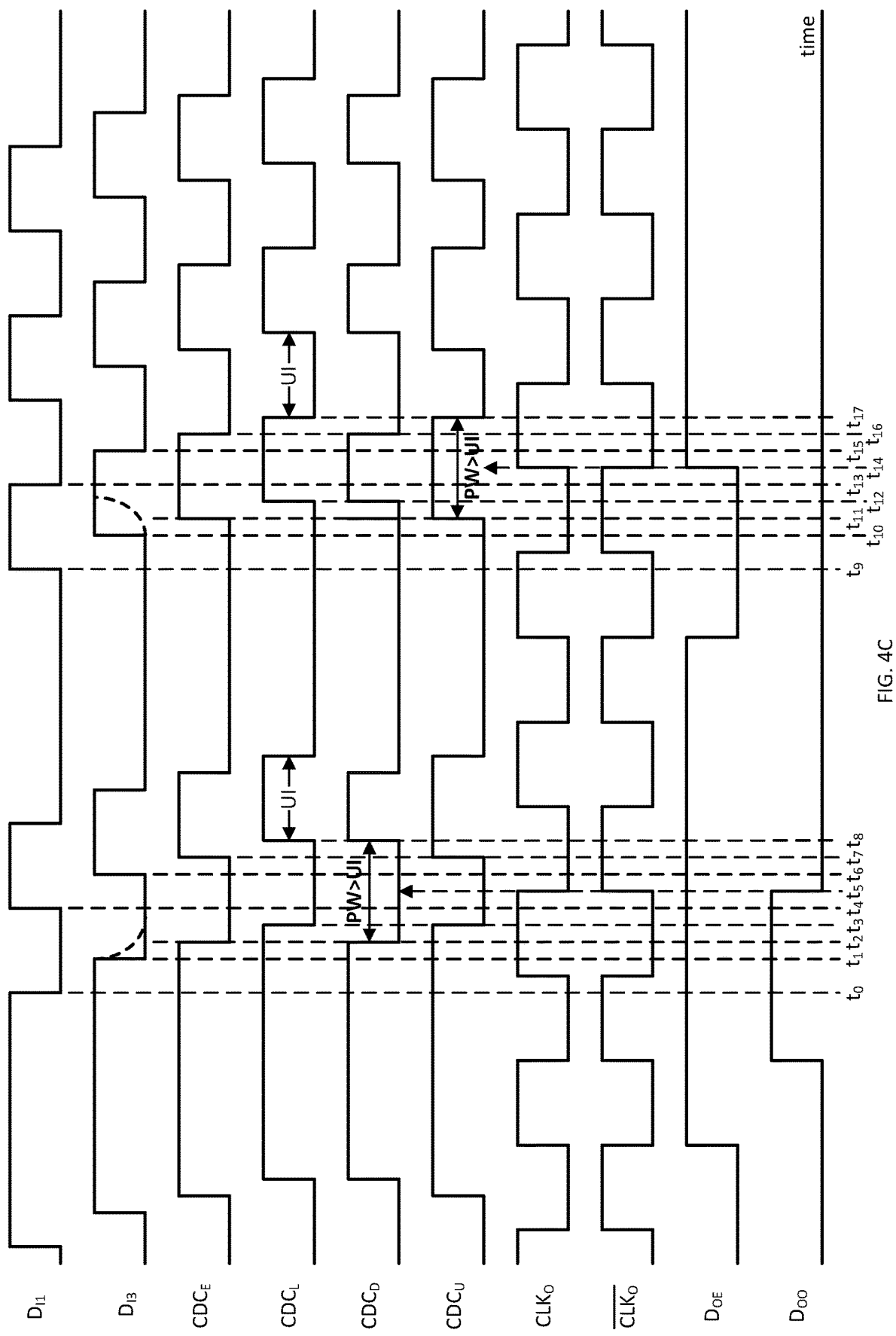
FIG. 4C illustrates a timing diagram of example signals related to an operation of the data signal receiver circuit of FIG. 4A in accordance with another aspect of the disclosure.

FIG. 4C illustrates a timing diagram of example signals related to an operation of the data signal receiver circuit 400 in accordance with another aspect of the disclosure. The horizontal axis of the timing diagram represents time. The vertical axis represents the logic state/voltage of various signals. For example, from top to bottom, the various signals include the first intermediate data signal $D_{I1}$, the third intermediate data signal $D_{13}$, the $CDC_E$ data signal, the $CDC_L$ data signal, the $CDC_D$ data signal, the $CDC_U$ data signal, the non-complementary clock signal $CLK_O$, the complementary clock signal $\overline{CLK_O}$, the even output data signal $D_{OE}$, and the odd output data signal $D_{OO}$.

With reference to FIGS. 4A-4C, at time $t_0$, the first intermediate data signal $D_{I1}$ experiences a falling transition indicating a start of a logic zero (0) following a logic one (1). In response to the falling transition, the third intermediate data signal $D_{I3}$ likewise experiences a falling transition at time $t_1$, after a delay associated with the signal delay circuit 415 and duty cycle adjuster (DCA) 420. At time $t_2$, after a delay associated with the first signal delay circuit 455 of the duty cycle control circuit 425/450, the $CDC_E$ signal responsively experiences a falling transition. At substantially the same time, the $CDC_D$ signal generated by the AND gate 470 responsively experiences a falling transition. Similarly, at time $t_3$, after a delay associated with the second and third delay circuits 460 and 465 of the duty cycle control circuit 425/450, the $CDC_L$ signal responsively experiences a falling transition. As both the $CDC_E$ and $CDC_L$ signals are logic zeros (0s) at time $t_3$, the $CDC_U$ signal generated by the OR gate 475 responsively experiences a falling transition.

As, in this example, the even output data signal $D_{OE}$ includes a previous bit of a logic one (1), the second multiplexer 435 outputs the $CDC_D$ data signal as the odd input data signal $D_{IO}$ at the data input of the second flip-flop 445. At time $t_5$, the complementary clock signal $\overline{CLK_O}$ experiences a rising (sampling) transition to cause the second flip-flop 445 to sample the odd input data signal $D_{IO}$ to generate the odd output data signal $D_{OO}$. Thus, as illustrated, at time $t_5$, the odd output data signal $D_{OO}$ becomes a logic zero (0) as a result of the first intermediate data signal $D_{I1}$ becoming a logic zero (0).

At time $t_4$ (prior to time $t_5$), the first intermediate data signal $D_{I1}$ experiences a rising transition. In response to the rising transition, the third intermediate data signal $D_{I3}$ likewise experiences a rising transition at time $t_6$, after a delay associated with the signal delay circuit 415 and duty cycle adjuster (DCA) 420. At time $t_7$, after a delay associated with the first signal delay circuit 455 of the duty cycle control circuit 425/450, the $CDC_E$ signal responsively experiences a rising transition. At substantially the same time, the $CDC_U$ signal generated by the OR gate 475 responsively experiences a rising transition. Similarly, at time $t_8$, after a delay associated with the second and third delay circuits 460 and 465 of the duty cycle control circuit 425/450, the $CDC_L$ signal responsively experiences a rising transition. As both the $CDC_E$ and $CDC_L$ signals are logic ones (1s) at time $t_8$, the $CDC_D$ signal generated by the AND gate 470 responsively experiences a rising transition.

Note that the logic zero (0) pulse width of the $CDC_D$ data signal that ends up being clocked as the next bit for the odd output data signal $D_{OO}$ is wider than the unit interval (UI) associated with the data signals being processed. For example, the logic zero (0) pulse of the $CDC_D$ data signal extends from time $t_2$ to time $t_8$ (e.g., 152 picoseconds (ps)). Whereas the pulses not compensated for ISI (e.g., such as the positive pulse of the $CDC_L$ signal following the aforementioned logic zero (0) pulse of the $CDC_D$ data signal) has the unit interval (UI) pulse width (e.g., 119 ps). The wider logic zero (0) pulse compensates for ISI pulse narrowing due to the previous bit being a logic one (1) to ensure successful sampling thereof. Further, note that the center/middle of the logic zero (0) pulse of the $CDC_D$ data signal substantially coincides with the rising (sampling) edge of the complementary clock signal $\overline{CLK_O}$ so that the second flip-flop 445 samples the odd input data signal $D_{IO}$ within the prescribed setup and hold timing margins to better ensure the data integrity of the odd output data signal $D_{OO}$.

With regard to a logic one (1) following a logic zero (0), at time $t_9$, the first intermediate data signal $D_{I1}$ experiences a rising transition indicating a start of a logic one (1) following a logic zero (0). In response to the rising transition, the third intermediate data signal $D_{I3}$ likewise experiences a rising transition at time $t_{10}$, after a delay associated with the signal delay circuit 415 and duty cycle adjuster (DCA) 420. At time $t_{11}$, after a delay associated with the first signal delay circuit 455 of the duty cycle control circuit 425/450, the $CDC_E$ signal responsively experiences a rising transition. At substantially the same time, the $CDC_U$ signal generated by the OR gate 475 responsively experiences a rising transition. Similarly, at time $t_{12}$, after a delay associated with the second and third delay circuits 460 and 465 of the duty cycle control circuit 425/450, the $CDC_L$ signal responsively experiences a rising transition. As both the $CDC_E$ and $CDC_L$ signals are logic ones (1s) at time $t_{12}$, the $CDC_D$ signal generated by the AND gate 470 responsively experiences a rising transition.

As the previous bit of the odd output data signal $D_{OO}$ is a logic zero (0), the first multiplexer 430 outputs the $CDC_U$ data signal as the even input data signal $D_{IE}$ at the data input of the first flip-flop 440. At time $t_{14}$, the non-complementary clock signal $CLK_O$ experiences a rising (sampling) transition to cause the first flip-flop 440 to sample the even input data signal $D_{IE}$ to generate the even output data signal $D_{OE}$. Thus, as illustrated, at time $t_{14}$, the even output data signal $D_{OE}$ becomes a logic one (1) as a result of the first intermediate data signal $D_{I1}$ becoming a logic one (1).

At time $t_{13}$ (prior to time $t_{14}$), the first intermediate data signal $D_{I1}$, experiences a falling transition. In response to the falling transition, the third intermediate data signal $D_{I3}$ likewise experiences a falling transition at time tis, after a delay associated with the signal delay circuit 415 and duty cycle adjuster (DCA) 420. At time $t_{16}$, after a delay associated with the first signal delay circuit 455 of the duty cycle control circuit 425/450, the $CDC_E$ signal responsively experiences a falling transition. At substantially the same time, the $CDC_D$ signal generated by the AND gate 470 responsively experiences a falling transition. Similarly, at time $t_{17}$, after a delay associated with the second and third delay circuits 460 and 465 of the duty cycle control circuit 425/450, the $CDC_L$ signal responsively experiences a falling transition. As both the $CDC_E$ and $CDC_L$ signals are logic zeros (0s) at time $t_{17}$, the $CDC_U$ signal generated by the OR gate 475 responsively experiences a falling transition.

Similarly note that the logic one (1) pulse width of the $CDC_U$ data signal that ends up being clocked as the next bit for the even output data signal $D_{OE}$ is wider than pulses not compensated for ISI or the UI. For example, the logic one (1) pulse of the $CDC_U$ data signal extends from time $t_{11}$ to time $t_{17}$ (e.g., 152 ps). Whereas the pulses not compensated for ISI (e.g., such as the negative pulse of the $CDC_L$ signal following the aforementioned logic one (1) pulse of the $CDC_U$ data signal) has the unit interval (UI) pulse width (e.g., 119 ps). The wider logic one (1) pulse compensates for ISI pulse narrowing due to the previous bit being a logic zero (0). Further, note that the center/middle of the logic one (1) pulse of the $CDC_U$ data signal substantially coincides with the rising (sampling) edge of the non-complementary clock signal $CLK_O$ so that the first flip-flop 440 samples the even input data signal $D_{IE}$ within the prescribed setup and hold timing margins to better ensure the data integrity of the even output data signal $D_{OE}$.

Figure 5:
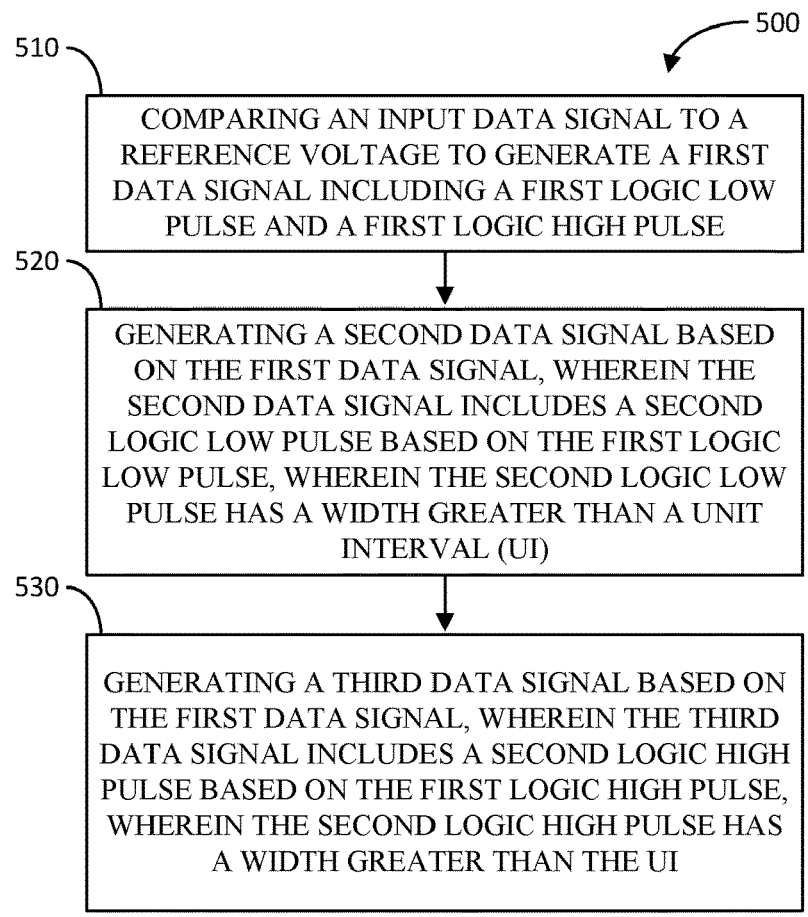
FIG. 5 illustrates a flow diagram of an example method of receiving a data signal in accordance with another aspect of the disclosure.

FIG. 5 illustrates a flow diagram of an example method 500 of receiving a signal in accordance with another aspect of the disclosure. The method 500 includes comparing an input data signal to a reference voltage to generate a first data signal including a first logic low pulse and a first logic high pulse (block 510). An example of means for comparing an input data signal to a reference voltage to generate a first data signal including a first logic low pulse and a first logic high pulse includes the comparator 410.

The method 500 further includes generating a second data signal based on the first data signal, wherein the second data signal includes a second logic low pulse based on the first logic low pulse, wherein the second logic low pulse has a width greater than a unit interval (UI) (block 520). An example of means for generating a second data signal based on the first data signal, wherein the second data signal includes a second logic low pulse based on the first logic low pulse, wherein the second logic low pulse has a width greater than a unit interval (UI) includes any of the duty cycle control circuits 425 or 450.

Further, the method 500 includes generating a third data signal based on the first data signal, wherein the third candidate data signal includes a second logic high pulse based on the first logic high pulse, wherein the second logic high pulse has a width greater than the UI (block 530). An example of means for generating a third data signal based on the first data signal, wherein the third candidate data signal includes a second logic high pulse based on the first logic high pulse, wherein the second logic high pulse has a width greater than the UI includes any of the duty cycle control circuits 425 or 450.

Wherein generating the second and third data signals, according to the method 500, may include: delaying the first data signal by a first delay to generate a fourth data signal; delaying the first data signal by a second delay to generate a fifth data signal; logically ANDing the fourth and fifth data signals to generate the second data signal; and logically ORing the fourth and fifth data signals to generate the third data signal. The second delay may be greater than the first delay.

An example of means for delaying the first data signal by a first delay to generate a fourth data signal includes the signal delay circuit 455. An example of means for delaying the first data signal by a second delay to generate a fifth data signal includes the cascaded signal delay circuits 460 and 465. An example means for logically ANDing the fourth and fifth data signals to generate the second data signal includes the AND gate 470. And, an example of means for logically ORing the fourth and fifth data signals to generate the third data signal includes the OR gate 475.

The method 500 may further include outputting the second data signal in response to a third logic high pulse preceding the first logic low pulse in the first data signal; or outputting the third data signal in response to a third logic low pulse preceding the first logic high pulse in the first data signal. An example of means for outputting the second data signal in response to a third logic high pulse preceding the first logic low pulse in the first data signal includes any one of the first or second multiplexer 430 or 435. Similarly, an example of means for outputting the third data signal in response to a third logic low pulse preceding the first logic high pulse in the first data signal includes any one of the first or second multiplexer 430 or 435.

The method 500 may further include sampling the outputted second or third data signal based on a clock signal. An example of means sampling the outputted second or third data signal based on a clock signal includes any of the first or second flip-flop 440 or 445.

Figure 6:
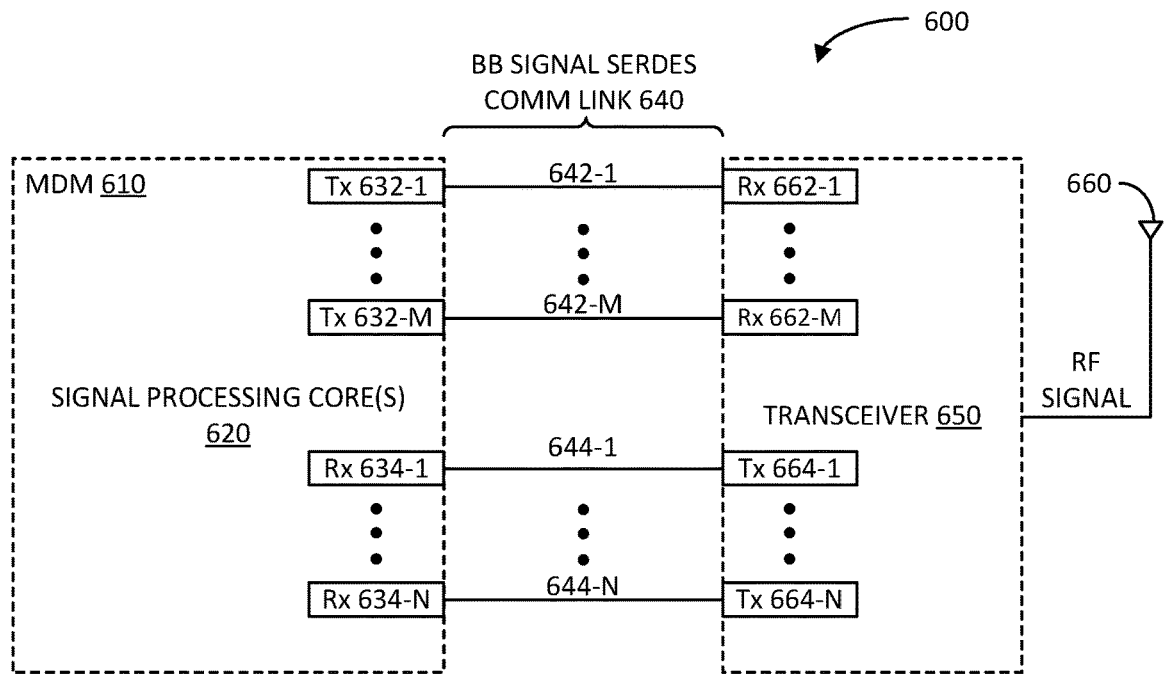
FIG. 6 illustrates a block diagram of an example wireless communication device in accordance with another aspect of the disclosure.

FIG. 6 illustrates a block diagram of an example wireless communication device 600 in accordance with another aspect of the disclosure. The wireless communication device 600 may be a smart phone, a desktop computer, laptop computer, tablet device, Internet of Things (IoT), wearable wireless device (e.g., wireless watch), and other types of wireless device.

In particular, the wireless communication device 600 includes a modem 610. The modem 610 includes one or more signal processing cores 620 configured to generate a transmit baseband (BB) data signal and process a received BB data signal. The modem 610 additionally includes a first set of one or more data signal transmitter circuits 632-1 to 632-M configured to transmit the transmit BB data signal including a first clock signal. The modem 610 additionally includes a first set of one or more signal receiver circuits 634-1 to 634-N configured to receive the received BB data signal including a second clock signal. Each of the first set of one or more data signal receiver circuits 634-1 to 634-N may be implemented per data signal receiver circuit 400.

The wireless communication device 600 includes a transceiver 650. The transceiver 650 is configured to convert the transmit BB signal into a transmit radio frequency (RF) signal, and convert a received RF signal into the received BB signal. The transceiver 650 is coupled to the at least one antenna 660 to provide thereto the transmit RF signal for electromagnetic radiation into a wireless medium for wireless transmission, and receive the received RF signal electromagnetically picked up from the wireless medium by the at least one antenna 660.

The transceiver 650 additionally includes a second set of one or more signal receiver circuits 662-1 to 662-M configured to receive the transmit BB data signal and the first clock signal. Each of the second set of one or more data signal receiver circuits 662-1 to 662-M may be implemented per data signal receiver circuits 400. The transceiver 650 additionally includes a second set of one or more signal transmitter circuits 664-1 to 664-N configured to transmit the received BB data signal and the second clock signal.

Additionally, the wireless communication device 600 further includes a BB signal SERDES communication link 640. The BB signal SERDES communication link 640 comprises a first set of one or more transmission lines 642-1 to 642-M coupling the first set of one or more signal transmitter circuits 632-1 to 632-M to the second set of one or more signal receiver circuits 662-1 to 662-M for transmission of the transmit BB signal, respectively. The BB signal SERDES communication link 640 comprises a second set of one or more transmission lines 644-1 to 642-N coupling the second set of one or more signal transmitter circuits 664-1 to 664-N to the first set of one or more signal receiver circuits 634-1 to 634-N for transmission of the received BB signal, respectively.

The following provides an overview of aspects of the present disclosure:

Aspect 1: A data signal receiver circuit, comprising: a comparator configured to generate a first data signal based on a comparison of an input data signal and a reference voltage, wherein the first data signal includes a first logic low pulse and a first logic high pulse; and a duty cycle control circuit configured to generate: a second data signal based on the first data signal, wherein the second data signal includes a second logic low pulse based on the first logic low pulse, wherein the second logic low pulse has a width greater than a unit interval (UI); and a third data signal based on the first data signal, wherein the third data signal includes a second logic high pulse based on the first logic high pulse, wherein the second logic high pulse has a width greater than the UI.

Aspect 2: The data signal receiver circuit of aspect 1, wherein the duty cycle control circuit comprises: a first signal delay circuit configured to effectuate a first delay of the first data signal to generate a fourth data signal; a second signal delay circuit configured to effectuate a second delay of the first data signal to generate a fifth data signal; a first logic gate configured to perform a first logic operation of the fourth and fifth data signals to generate the second data signal; and a second logic gate configured to perform a second logic operation of the fourth and fifth data signals to generate the third data signal.

Aspect 3: The data signal receiver circuit of aspect 2, wherein: the first logic operation comprises an ANDing of the fourth and fifth data signals; and the second logic operation comprises an ORing of the fourth and fifth data signals.

Aspect 4: The data signal receiver circuit of aspect 2 or 3, wherein at least one of the first or second signal delay circuit includes one or more current-starved inverters.

Aspect 5: The data signal receiver circuit of any one of aspects 2-4, wherein the second delay is greater than the first delay.

Aspect 6: The data signal receiver circuit of any one of aspects 1-5, further comprising a multiplexer including a first input configured to receive the second data signal, a second input configured to receive the third data signal, and a select input configured to receive a selection signal.

Aspect 7: The data signal receiver circuit of aspect 6, wherein the multiplexer is configured to: output the second data signal in response to the selection signal indicating a third logic high pulse preceding the first logic low pulse in the first data signal; or output the third data signal in response to the selection signal indicating a third logic low pulse preceding the first logic high pulse in the first data signal.

Aspect 8: The data signal receiver circuit of aspect 7, further comprising a first flip-flop configured to sample the second or third data signal outputted by the multiplexer based on a non-complementary clock signal to generate a first output data signal.

Aspect 9: The data signal receiver circuit of aspect 8, further comprising a second flip-flop configured to generate a second output data signal based on the third logic high or low pulse and a complementary clock signal, wherein the selection signal comprises the second output data signal.

Aspect 10: The data signal receiver circuit of any one of aspects 1-9, further comprising a signal delay circuit configured to delay a fourth data signal generated by the comparator to generate the first data signal.

Aspect 11: The data signal receiver circuit of aspect 10, further comprising a duty cycle adjuster configured to adjust a duty cycle of the fourth data signal to generate the first data signal.

Aspect 12: The data signal receiver circuit of any one of aspects 1-11, further comprising a reference voltage generator configured to generate the reference voltage.

Aspect 13: A data signal receiver circuit, comprising: a comparator including a first input configured to receive an input data signal, a second input configured to receive a reference voltage; a duty cycle control circuit including an input coupled to an output of the comparator; a first multiplexer including a first input coupled to a first output of the duty cycle control circuit, a second input coupled to a second output of the duty cycle control circuit; a second multiplexer including a first input coupled to the first output of the duty cycle control circuit, a second input coupled to the second output of the duty cycle control circuit; a first flip-flop including a data input coupled to an output of the first multiplexer, a clock input configured to receive a non-complementary clock signal, and an output configured to generate a first output data signal, wherein the output of the first flip-flop is coupled to a select input of the second multiplexer; and a second flip-flop including a data input coupled to an output of the second multiplexer, a clock input configured to receive a complementary clock signal, and an output configured to generate a second output data signal, wherein the output of the second flip-flop is coupled to a select input of the first multiplexer.

Aspect 14: The data signal receiver circuit of aspect 13, wherein the duty cycle control circuit comprises: a first signal delay circuit coupled to the input of duty cycle control circuit; a second signal delay circuit coupled to the input of duty cycle control circuit; a first logic gate including first and second inputs coupled to the first and second signal delay circuits, respectively, and an output coupled to the first output of the duty cycle control circuit; and a second logic gate including first and second inputs coupled to the first and second signal delay circuits, respectively, and an output coupled to the second output of the duty cycle control circuit.

Aspect 15: The data signal receiver circuit of aspect 14, wherein the first logic gate comprises an AND gate, and the second logic gate comprises an OR gate.

Aspect 16: The data signal receiver circuit of aspect 15, wherein the first signal delay circuit is configured to effectuate a first delay of a signal, wherein the second signal delay circuit is configured to effectuate a second delay of the signal, and wherein the second delay is greater than the first delay.

Aspect 17: The data signal receiver circuit of aspect 15 or 16, wherein at least one of the first or second signal delay circuit includes one or more current-starved inverters.

Aspect 18: The data signal receiver circuit of any one of aspects 13-17, further comprising a signal delay circuit including an input coupled to the output of the comparator, and an output coupled to the input of the duty cycle control circuit.

Aspect 19: The data signal receiver circuit of any one of aspects 13-18, further comprising a duty cycle adjuster including an input coupled to the output of the comparator, and an output coupled to the input of the duty cycle control circuit.

Aspect 20: The data signal receiver circuit of any one of aspects 13-19, further comprising a reference voltage generator coupled to the second input of the comparator.

Aspect 21: A method, comprising: comparing an input data signal to a reference voltage to generate a first data signal including a first logic low pulse and a first logic high pulse; generating a second data signal based on the first data signal, wherein the second data signal includes a second logic low pulse based on the first logic low signal, wherein the second logic low pulse has a width greater than a unit interval (UI); and generating a third data signal based on the first data signal, wherein the third data signal includes a second logic high pulse based on the first logic high pulse, wherein the second logic high pulse has a width greater than the UI.

Aspect 22: The method of aspect 21, wherein generating the second and third data signals comprises: delaying the first data signal by a first delay to generate a fourth data signal; delaying the first data signal by a second delay to generate a fifth data signal; logically ANDing the fourth and fifth data signals to generate the second data signal; and logically ORing the fourth and fifth data signals to generate the third data signal.

Aspect 23: The method of aspect 22, wherein the second delay is greater than the first delay.

Aspect 24: The method of any one of aspects 21-23, further comprising: outputting the second data signal in response to a third logic high pulse preceding the first logic low pulse in the first data signal; or outputting the third data signal in response to a third logic low pulse preceding the first logic high pulse in the first data signal.

Aspect 25: The method of aspect 24, further comprising sampling the outputted second or third data signal based on a clock signal.

Aspect 26: An apparatus, comprising: means for comparing an input data signal to a reference voltage to generate a first data signal including a first logic low pulse and a first logic high pulse; means for generating a second data signal based on the first data signal, wherein the second data signal includes a second logic low pulse based on the first logic low pulse, wherein the second logic low pulse has a width greater than a unit interval (UI); and means for generating a third data signal based on the first data signal, wherein the third data signal includes a second logic high pulse based on the first logic high pulse, wherein the second logic high pulse has a width greater than the UI.

Aspect 27: The apparatus of aspect 26, wherein generating the second and third data signals comprises: means for delaying the first data signal by a first delay to generate a fourth data signal; means for delaying the first data signal by a second delay to generate a fifth data signal; means for logically ANDing the fourth and fifth data signals to generate the second data signal; and means for logically ORing the fourth and fifth data signals to generate the third data signal.

Aspect 28: The apparatus of aspect 27, wherein the second delay is greater than the first delay.

Aspect 29: The apparatus of any one of aspects 26-28, further comprising: means for outputting the second data signal in response to a third logic high pulse preceding the first logic low pulse in the first data signal; or means for outputting the third data signal in response to a third logic low pulse preceding the first logic high pulse in the first data signal.

Aspect 30: The apparatus of aspect 29, further comprising means for sampling the outputted second or third data signal based on a clock signal.

Aspect 31: A wireless communication device, comprising: at least one antenna; a transceiver coupled to the at least one antenna; and a modem including one or more signal processing cores coupled to the transceiver, wherein at least one of the transceiver or the modem includes a data signal receiver circuit comprising: a comparator configured to generate a first data signal based on a comparison of an input data signal and a reference voltage, wherein the first data signal includes a first logic low pulse and a first logic high pulse; and a duty cycle control circuit configured to generate: a second data signal based on the first data signal, wherein the second data signal includes a second logic low pulse responsive to the first logic low pulse, wherein the second logic low pulse has a width greater than a unit interval (UI); and a third data signal based on the first data signal, wherein the third data signal includes a second logic high pulse responsive to the first logic high pulse, wherein the second logic high pulse has a width greater than the UI.

Aspect 32: A wireless communication device, comprising: at least one antenna; a transceiver coupled to the at least one antenna; and a modem including one or more signal processing cores coupled to the transceiver, wherein at least one of the transceiver or the modem includes a data signal receiver circuit comprising: a comparator including a first input configured to receive an input data signal, a second input configured to receive a reference voltage; a duty cycle control circuit including an input coupled to an output of the comparator; a first multiplexer including a first input coupled to a first output of the duty cycle control circuit, a second input coupled to a second output of the duty cycle control circuit; a second multiplexer including a first input coupled to the first output of the duty cycle control circuit, a second input coupled to the second output of the duty cycle control circuit; a first flip-flop including a data input coupled to an output of the first multiplexer, a clock input configured to receive a non-complementary clock signal, and an output configured to generate a first output data signal, wherein the output of the first flip-flop is coupled to a select input of the second multiplexer; and a second flip-flop including a data input coupled to an output of the second multiplexer, a clock input configured to receive a complementary clock signal, and an output configured to generate a second output data signal, wherein the output of the second flip-flop is coupled to a select input of the first multiplexer.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. A data signal receiver circuit, comprising:
   a comparator configured to generate a first data signal based on a comparison of an input data signal and a reference voltage, wherein the first data signal includes a first logic low pulse and a first logic high pulse; and
   a duty cycle control circuit configured to generate:
     a second data signal based on the first data signal, wherein the second data signal includes a second logic low pulse based on the first logic low pulse, wherein the second logic low pulse has a width greater than a unit interval (UI); and
     a third data signal based on the first data signal, wherein the third data signal includes a second logic high pulse based on the first logic high pulse, wherein the second logic high pulse has a width greater than the UI; wherein the duty cycle control circuit comprises
     a first signal delay circuit configured to effectuate a first delay of the first data signal to generate a fourth data signal;
     a second signal delay circuit configured to effectuate a second delay of the first data signal to generate a fifth data signal;
     a first logic gate configured to perform a first logic operation of the fourth and fifth data signals to generate the second data signal; and
     a second logic gate configured to perform a second logic operation of the fourth and fifth data signals to generate the third data signal.

2. The data signal receiver circuit of claim 1, wherein:
   the first logic operation comprises an ANDing of the fourth and fifth data signals; and
   the second logic operation comprises an ORing of the fourth and fifth data signals.

3. The data signal receiver circuit of claim 1, wherein at least one of the first or second signal delay circuit includes one or more current-starved inverters.

4. The data signal receiver circuit of claim 1, wherein the second delay is greater than the first delay.

5. The data signal receiver circuit of claim 1, further comprising a multiplexer including a first input configured to receive the second data signal, a second input configured to receive the third data signal, and a select input configured to receive a selection signal.

6. The data signal receiver circuit of claim 5, wherein the multiplexer is configured to:
   output the second data signal in response to the selection signal indicating a third logic high pulse preceding the first logic low pulse in the first data signal; or
   output the third data signal in response to the selection signal indicating a third logic low pulse preceding the first logic high pulse in the first data signal.

7. The data signal receiver circuit of claim 6, further comprising a first flip-flop configured to sample the second or third data signal outputted by the multiplexer based on a non-complementary clock signal to generate a first output data signal.

8. The data signal receiver circuit of claim 7, further comprising a second flip-flop configured to generate a second output data signal based on the third logic high or low pulse and a complementary clock signal, wherein the selection signal comprises the second output data signal.

9. The data signal receiver circuit of claim 1, further comprising a signal delay circuit configured to delay a first intermediate data signal generated by the comparator to generate the first data signal.

10. The data signal receiver circuit of claim 9, further comprising a duty cycle adjuster configured to adjust a duty cycle of the first intermediate data signal to generate the first data signal.

11. The data signal receiver circuit of claim 1, further comprising a reference voltage generator configured to generate the reference voltage.

12. A data signal receiver circuit, comprising:
    a comparator including a first input configured to receive an input data signal, a second input configured to receive a reference voltage;
    a duty cycle control circuit including
      an input coupled to an output of the comparator,
      a first signal delay circuit coupled to the input of duty cycle control circuit,
      a second signal delay circuit coupled to the input of duty cycle control circuit,
      a first logic gate including first and second inputs coupled to the first and second signal delay circuits, respectively, and an output coupled to the first output of the duty cycle control circuit, and
      a second logic gate including first and second inputs coupled to the first and second signal delay circuits, respectively, and an output coupled to the second output of the duty cycle control circuit;
    a first multiplexer including a first input coupled to a first output of the duty cycle control circuit, a second input coupled to a second output of the duty cycle control circuit;
    a second multiplexer including a first input coupled to the first output of the duty cycle control circuit, a second input coupled to the second output of the duty cycle control circuit;
    a first flip-flop including a data input coupled to an output of the first multiplexer, a clock input configured to receive a non-complementary clock signal, and an output configured to generate a first output data signal, wherein the output of the first flip-flop is coupled to a select input of the second multiplexer; and a second flip-flop including a data input coupled to an output of the second multiplexer, a clock input configured to receive a complementary clock signal, and an output configured to generate a second output data signal, wherein the output of the second flip-flop is coupled to a select input of the first multiplexer.

13. The data signal receiver circuit of claim 12, wherein the first logic gate comprises an AND gate, and the second logic gate comprises an OR gate.

14. The data signal receiver circuit of claim 13, wherein the first signal delay circuit is configured to effectuate a first delay of a signal, wherein the second signal delay circuit is configured to effectuate a second delay of the signal, and wherein the second delay is greater than the first delay.

15. The data signal receiver circuit of claim 13, wherein at least one of the first or second signal delay circuit includes one or more current-starved inverters.

16. The data signal receiver circuit of claim 12, further comprising a signal delay circuit including an input coupled to the output of the comparator, and an output coupled to the input of the duty cycle control circuit.

17. The data signal receiver circuit of claim 12, further comprising a duty cycle adjuster including an input coupled to the output of the comparator, and an output coupled to the input of the duty cycle control circuit.

18. The data signal receiver circuit of claim 12, further comprising a reference voltage generator coupled to the second input of the comparator.

19. A method, comprising:
comparing an input data signal to a reference voltage to generate a first data signal including a first logic low pulse and a first logic high pulse;
generating a second data signal based on the first data signal, wherein the second data signal includes a second logic low pulse based on the first logic low pulse, wherein the second logic low pulse has a width greater than a unit interval (UI); and
generating a third data signal based on the first data signal, wherein the third data signal includes a second logic high pulse based on the first logic high pulse, wherein the second logic high pulse has a width greater than the UI, wherein generating the second and third data signals comprises:
delaying the first data signal by a first delay to generate a fourth data signal;
delaying the first data signal by a second delay to generate a fifth data signal;
logically ANDing the fourth and fifth data signals to generate the second data signal; and
logically ORing the fourth and fifth data signals to generate the third data signal.

20. The method of claim 19, wherein the second delay is greater than the first delay.

21. The method of claim 19, further comprising:
outputting the second data signal in response to a third logic high pulse preceding the first logic low pulse in the first data signal; or
outputting the third data signal in response to a third logic low pulse preceding the first logic high pulse in the first data signal.

22. The method of claim 21, further comprising sampling the outputted second or third data signal based on a clock signal.

23. An apparatus, comprising:
means for comparing an input data signal to a reference voltage to generate a first data signal including a first logic low pulse and a first logic high pulse;
means for generating a second data signal based on the first data signal, wherein the second data signal includes a second logic low pulse based on the first logic low signal, wherein the second logic low pulse has a width greater than a unit interval (UI); and
means for generating a third data signal based on the first data signal, wherein the third data signal includes a second logic high pulse based on the first logic high pulse, wherein the second logic high pulse has a width greater than the UI, wherein the means for generating the second and third data signals comprises
means for delaying the first data signal by a first delay to generate a fourth data signal;
means for delaying the first data signal by a second delay to generate a fifth data signal;
means for logically ANDing the fourth and fifth data signals to generate the second data signal; and
means for logically ORing the fourth and fifth data signals to generate the third data signal.

24. The apparatus of claim 23, wherein the second delay is greater than the first delay.

25. The apparatus of claim 23, further comprising:
means for outputting the second data signal in response to a third logic high pulse preceding the first logic low pulse in the first data signal; or
means for outputting the third data signal in response to a third logic low pulse preceding the first logic high pulse in the first data signal.

26. The apparatus of claim 25, further comprising means for sampling the outputted second or third data signal based on a clock signal.

* * * * *